US008847470B2

(12) United States Patent
Ikeuchi et al.

(10) Patent No.: US 8,847,470 B2
(45) Date of Patent: Sep. 30, 2014

(54) METHOD FOR PRODUCING PIEZOELECTRIC THIN-FILM ELEMENT, PIEZOELECTRIC THIN-FILM ELEMENT, AND MEMBER FOR PIEZOELECTRIC THIN-FILM ELEMENT

(71) Applicant: Murata Manufacturing Co., Ltd., Nagaokakyo (JP)

(72) Inventors: Shinsuke Ikeuchi, Nagaokakyo (JP); Kansho Yamamoto, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/748,687

(22) Filed: Jan. 24, 2013

(65) Prior Publication Data

US 2013/0127293 A1    May 23, 2013

Related U.S. Application Data

(63) Continuation of application No. PCT/JP2011/066896, filed on Jul. 26, 2011.

(30) Foreign Application Priority Data

Aug. 12, 2010  (JP) .................................. 2010-180932

(51) Int. Cl.
*H01L 41/22* (2013.01)
*C23C 14/08* (2006.01)
*H01L 41/187* (2006.01)
*H01L 41/316* (2013.01)
*H01L 41/319* (2013.01)
*H01L 41/08* (2006.01)
*C23C 14/00* (2006.01)

(52) U.S. Cl.
CPC .......... *H01L 41/0805* (2013.01); *C23C 14/088* (2013.01); *C23C 14/083* (2013.01); *H01L 41/1873* (2013.01); *H01L 41/316* (2013.01); *C23C 14/0036* (2013.01); *H01L 41/22* (2013.01); *H01L 41/319* (2013.01); *H01L 41/0815* (2013.01)
USPC .......................................... 310/358; 310/311

(58) Field of Classification Search
USPC ......... 310/311, 361, 363–367, 320–321, 358, 310/348, 359, 357, 328; 252/62.9 PZ
See application file for complete search history.

(56) References Cited

U.S. PATENT DOCUMENTS 6,328,883 B1 * 12/2001 Jensen .......................... 210/136
6,411,017 B1 *  6/2002 Qiu et al. ...................... 310/358

(Continued)

FOREIGN PATENT DOCUMENTS

CN    1380187 A    11/2002
CN    1647923 A     8/2005

(Continued)

OTHER PUBLICATIONS

International Search Report and Written Opinion, issued in PCT/JP2011/066896, mailed Aug. 23, 2011.

*Primary Examiner* — Thomas Dougherty
*Assistant Examiner* — Karen B Addison
(74) *Attorney, Agent, or Firm* — Dickstein Shapiro LLP (57) ABSTRACT

Provided is a method for producing a piezoelectric thin-film element including a piezoelectric thin-film layer having good surface morphology and high crystallinity. The method includes forming a lower electrode layer on a substrate; forming a piezoelectric thin-film buffer layer on the lower electrode layer at a relatively low film-formation temperature; forming a piezoelectric thin-film layer on the piezoelectric thin-film buffer layer at a film-formation temperature that is higher than the film-formation temperature for the piezoelectric thin-film buffer layer; and forming an upper electrode layer on the piezoelectric thin-film layer.

9 Claims, 9 Drawing Sheets

(56) References Cited

U.S. PATENT DOCUMENTS

| | | | |
|---|---|---|---|
| 6,639,340 B1 * | 10/2003 | Qiu et al. | 310/358 |
| 7,053,526 B2 | 5/2006 | Unno et al. | |
| 7,320,163 B2 | 1/2008 | Xin-Shan et al. | |
| 7,453,188 B2 * | 11/2008 | Matsuda et al. | 310/358 |
| 7,710,003 B2 * | 5/2010 | Shibata et al. | 310/358 |
| 7,766,464 B2 | 8/2010 | Noguchi et al. | |
| 7,901,800 B2 | 3/2011 | Shibata et al. | |
| 8,004,163 B2 * | 8/2011 | Shibata et al. | 310/358 |

FOREIGN PATENT DOCUMENTS

| | | | | |
|---|---|---|---|---|
| CN | 1666870 A | | 9/2005 | |
| CN | 101393960 A | | 3/2009 | |
| JP | 2005-227408 | * | 10/2005 | .............. H01L 41/09 |
| JP | 2005-277408 | * | 10/2005 | .............. H01L 14/09 |
| JP | 2005277408 A | | 10/2005 | |
| JP | 2007019302 A | | 1/2007 | |
| JP | 2008048315 A | | 2/2008 | |
| JP | 2008160092 A | | 7/2008 | |
| JP | 2009117785 A | | 5/2009 | |

\* cited by examiner

PRIOR ART

METHOD FOR PRODUCING PIEZOELECTRIC THIN-FILM ELEMENT, PIEZOELECTRIC THIN-FILM ELEMENT, AND MEMBER FOR PIEZOELECTRIC THIN-FILM ELEMENT

The present application is a continuation of International application No. PCT/JP2011/066896, filed Jul. 26, 2011, which claims priority to Japanese Patent Application No. 2010-180932, filed Aug. 12, 2010, the entire contents of each of which are incorporated herein by reference.

TECHNICAL FIELD

The present invention relates to a method for producing a piezoelectric thin-film element having a structure in which a piezoelectric thin-film layer is disposed between a lower electrode layer and an upper electrode layer; a piezoelectric thin-film element; and a member for a piezoelectric thin-film element.

BACKGROUND ART

In order to reduce the size of actuators and piezoelectric sensors, various piezoelectric thin-film elements including piezoelectric thin films have been proposed.

Figure 11:
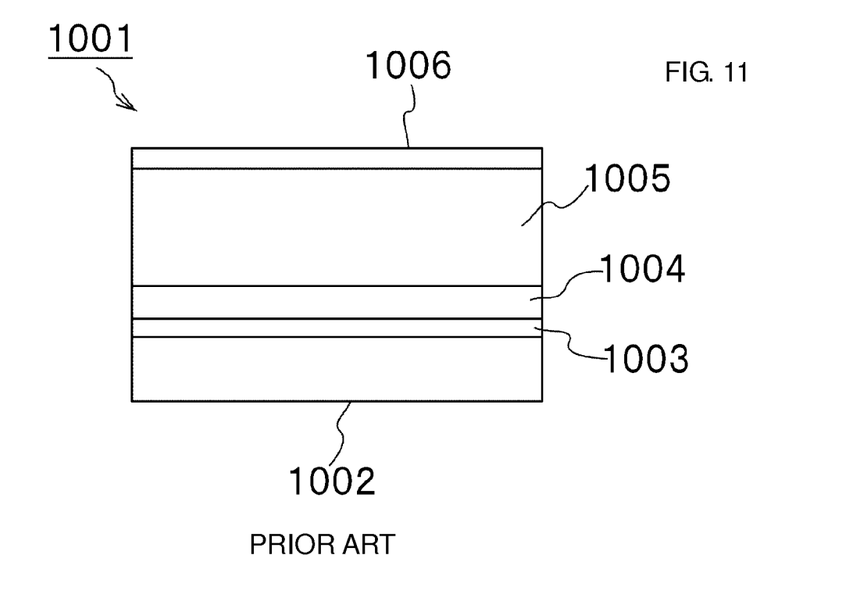
FIG. 11 is an elevational view of an existing piezoelectric thin-film element serving as an example.

For example, Patent Document 1 described below discloses a piezoelectric thin-film element 1001 illustrated in FIG. 11.

The piezoelectric thin-film element 1001 includes a substrate 1002. On the substrate 1002, a lower electrode 1003, an underlying dielectric thin film 1004, a piezoelectric thin film 1005, and an upper electrode 1006 are stacked in this order. The piezoelectric thin-film element 1001 is produced in the following manner. On the substrate 1002 composed of Si, the lower electrode 1003 is formed by sputtering. On the lower electrode 1003, the underlying dielectric thin film 1004 composed of an alkaline niobium oxide represented by $(Na_{x2}K_{y2}Li_{z2})NbO_3$ ($0 \leq x2 \leq 1$, $0 \leq y2 \leq 1$, $0 \leq z2 \leq 1$, $x2+y2+z2=1$) is then formed by sputtering at a substrate temperature of 650° C. Subsequently, on the underlying dielectric thin film 1004, the piezoelectric thin film 1005 composed of an alkaline niobium oxide represented by a general formula $(Na_{x1}K_{y1}Li_{z1})NbO_3$ ($0 \leq x1 \leq 1$, $0 \leq y1 \leq 1$, $0 \leq z1 \leq 1$, $x1+y1+z1=1$) is then formed by sputtering at a substrate temperature of 650° C. On the piezoelectric thin film 1005, the upper electrode 1006 is then formed by sputtering.

The sodium composition proportions of the underlying dielectric thin film 1004 and the piezoelectric thin film 1005 are defined as $0 < x2 < x1$.

In the formation of the piezoelectric thin film 1005 composed of an alkaline niobium oxide and in the formation of the underlying dielectric thin film 1004 composed of an alkaline niobium oxide and serving as an underlying film, the sodium composition proportions are different and hence targets having different compositions are used.

CITATION LIST

Patent Document 1: Japanese Unexamined Patent Application Publication No. 2008-160092

SUMMARY OF INVENTION

Technical Problem

In the method for producing the piezoelectric thin-film element described in Patent Document 1, a target for forming the underlying dielectric thin film 1004 and a target for forming the piezoelectric thin film 1005 need to be prepared. This increases the cost, which is problematic.

In addition, the underlying dielectric thin film 1004 is formed at a high temperature of 650° C., as is the piezoelectric thin film 1005. Accordingly, the heat in the lower electrode 1003 may cause oxidation or integration of grains and recrystallization. Thus, the surface of the lower electrode 1003 is roughened, which is problematic. When the surface of the lower electrode 1003 is roughened, the surface morphology of the underlying dielectric thin film 1004 formed on the lower electrode 1003 is also degraded. Accordingly, the surface morphology of the piezoelectric thin film 1005 formed on the underlying dielectric thin film 1004 is also degraded, which is problematic.

An object of the present invention is to provide a method for producing a piezoelectric thin-film element, the method allowing inexpensive production of a piezoelectric thin-film element that includes a piezoelectric thin-film layer having good surface morphology, that is, excellent surface smoothness. Another object of the present invention is to provide a piezoelectric thin-film element and a member for a piezoelectric thin-film element in which a piezoelectric thin film has good surface morphology.

Solution to Problem

The present invention provides a method for producing a piezoelectric thin-film element having a structure in which a lower electrode layer, a piezoelectric thin-film buffer layer, a piezoelectric thin-film layer, and an upper electrode layer are stacked in this order on a substrate. This production method according to the present invention includes the steps of forming the lower electrode layer on the substrate; forming the piezoelectric thin-film buffer layer on the lower electrode layer at a film-formation temperature that is lower than a film-formation temperature for the piezoelectric thin-film layer; forming the piezoelectric thin-film layer on the piezoelectric thin-film buffer layer at the film-formation temperature that is higher than the film-formation temperature for the piezoelectric thin-film buffer layer; and forming the upper electrode layer on the piezoelectric thin-film layer.

In an embodiment of a method for producing a piezoelectric thin-film element according to the present invention, the film-formation temperature for the piezoelectric thin-film buffer layer is a temperature at which the piezoelectric thin-film buffer layer does not crystallize, and the film-formation temperature for the piezoelectric thin-film layer is a temperature at which the piezoelectric thin-film buffer layer and the piezoelectric thin-film layer crystallize. In this case, the piezoelectric thin-film buffer layer and the piezoelectric thin-film layer crystallize in the formation of the piezoelectric thin-film layer. Thus, a piezoelectric thin-film and a piezoelectric thin-film buffer layer having better surface morphology can be formed.

In another embodiment of a method for producing a piezoelectric thin-film element according to the present invention, the film-formation temperature for the piezoelectric thin-film buffer layer is equal to or lower than a film-formation temperature for the lower electrode layer. In this case, since the film-formation temperature for the piezoelectric thin-film buffer layer is low, even when the lower electrode is formed at a high temperature and have poor surface morphology, the surface morphology of the piezoelectric thin-film buffer layer can be made good. Accordingly, the surface morphology of the piezoelectric thin-film layer formed on the piezoelectric thin-film buffer layer can be made good.

In still another embodiment of a method for producing a piezoelectric thin-film element according to the present invention, the piezoelectric thin-film buffer layer is formed so as to include a plurality of piezoelectric thin-film buffer layers. The plurality of piezoelectric thin-film buffer layers are preferably formed such that a film-formation temperature for the plurality of piezoelectric thin-film buffer layers is increased continuously or in a stepwise manner from a piezoelectric thin-film buffer layer on a side of the lower electrode layer to a piezoelectric thin-film buffer layer on a side of the piezoelectric thin-film layer. In this case, the surface morphology of the piezoelectric thin-film buffer layer on the side of the piezoelectric thin-film layer can be made better and the surface morphology of the piezoelectric thin-film layer formed thereon can be further improved.

In still another embodiment of a method for producing a piezoelectric thin-film element according to the present invention, the piezoelectric thin-film buffer layer and the piezoelectric thin-film layer are formed by sputtering. When the piezoelectric thin-film buffer layer and the piezoelectric thin-film layer are both formed by sputtering, the production method can be simplified. The piezoelectric thin-film buffer layer and the piezoelectric thin-film layer are preferably formed with the same target. In this case, since the piezoelectric thin-film buffer layer and the piezoelectric thin-film layer can be formed with a target of a single type, the cost can be reduced.

In a limited embodiment of a method for producing a piezoelectric thin-film element according to the present invention, the piezoelectric thin-film buffer layer and the piezoelectric thin-film layer have a perovskite structure containing K, Na, and Nb. In this case, the piezoelectric thin-film buffer layer and the piezoelectric thin-film layer that are free from Pb can be formed. The piezoelectric thin-film buffer layer and the piezoelectric thin-film layer preferably have a composition represented by a general formula (1) below.

$$(K_{1-a-b/2}Na_{a-b/2}A_b)(Nb_{1-c}B_c)O_3 \qquad \text{formula (1)}$$

In the general formula (1), A is at least one element from Li, Ag, Ca, Sr, Bi, and Gd; B is at least one element selected from the group consisting of Ta, Zr, Ti, Al, Sc, and Hf; and a, b, and c satisfy $0<a\leq0.9$, $0\leq b\leq0.3$, $0\leq a+b\leq0.9$, and $0\leq c\leq0.3$.

In a production method according to the present invention, the piezoelectric thin-film buffer layer and the piezoelectric thin-film layer may contain at least one metal or oxide of the metal, the at least one metal being selected from the group consisting of Mn, Mg, Zn, Fe, Cu, and Yb, such that a content of the at least one metal and oxide of the metal is 10 mol % or less with respect to 100 mol % of the composition represented by the general formula (1).

A piezoelectric thin-film element according to the present invention is produced by a method for producing a piezoelectric thin-film element according to the present invention.

A member for a piezoelectric thin-film element according to the present invention is a member being used for a method for producing a piezoelectric thin-film element in which a lower electrode layer, a piezoelectric thin-film buffer layer, a piezoelectric thin-film layer, and an upper electrode layer are stacked in this order on a substrate, the member including a substrate; a lower electrode layer formed on the substrate; and a piezoelectric thin-film buffer layer that is formed on the lower electrode layer at a film-formation temperature at which the piezoelectric thin-film buffer layer does not crystallize. A piezoelectric thin-film element according to the present invention includes the member for a piezoelectric thin-film element, a piezoelectric thin-film layer formed on the piezoelectric thin-film buffer layer of the member, and an upper electrode layer formed on the piezoelectric thin-film layer, wherein the piezoelectric thin-film layer is formed at a temperature equal to or higher than a temperature at which the piezoelectric thin-film layer crystallizes, and this formation results in crystallization of the piezoelectric thin-film buffer layer and the piezoelectric thin-film layer.

A broad embodiment of the present invention provides a piezoelectric thin-film element including a substrate; a lower electrode layer formed on the substrate; a piezoelectric thin-film buffer layer that is formed on the lower electrode layer and contains granular crystals; a piezoelectric thin-film layer that is formed on the piezoelectric thin-film buffer layer and contains columnar crystals; and an upper electrode layer formed on the piezoelectric thin-film layer.

In a piezoelectric thin-film element according to the present invention, the piezoelectric thin-film buffer layer and the piezoelectric thin-film layer preferably have a perovskite structure containing K, Na, and Nb. Accordingly, the piezoelectric thin-film buffer layer and the piezoelectric thin-film layer that are free from Pb can be formed.

In a piezoelectric thin-film element according to the present invention, the piezoelectric thin-film buffer layer and the piezoelectric thin-film layer preferably have different K/Na ratios.

The piezoelectric thin-film buffer layer and the piezoelectric thin-film layer preferably have a composition represented by the general formula (1) described above.

In this case, the piezoelectric thin-film buffer layer and the piezoelectric thin-film layer may also contain at least one metal or oxide of the metal, the at least one metal being selected from the group consisting of Mn, Mg, Zn, Fe, Cu, and Yb, such that a total content of the at least one metal and oxide of the metal is 10 mol % or less with respect to 100 mol % of the composition represented by the general formula (1).

Advantageous Effects of Invention

In a method for producing a piezoelectric thin-film element according to the present invention, the piezoelectric thin-film buffer layer is formed on the lower electrode layer at a film-formation temperature that is lower than a film-formation temperature for the piezoelectric thin-film layer, and the piezoelectric thin-film layer is then formed on the piezoelectric thin-film buffer layer at the film-formation temperature that is higher than the film-formation temperature for the piezoelectric thin-film buffer layer. Accordingly, in the formation of the piezoelectric thin-film buffer layer, its surface morphology is less likely to be degraded. Subsequently, the piezoelectric thin-film buffer layer crystallizes and the piezoelectric thin-film layer having good surface morphology can be formed during the formation of the piezoelectric thin-film layer at a higher temperature. Thus, a piezoelectric thin-film element that includes a piezoelectric thin film having excellent surface smoothness and high crystallinity can be provided.

In a piezoelectric thin-film element according to another broad embodiment of the present invention, the piezoelectric thin-film buffer layer contains granular crystals generated due to discontinuity of potassium sodium niobate crystals grown from the lower electrode layer. Thus, information from the lower electrode layer is blocked. As a result, the pyrochlore phase that is different from but closely lattice-matches with the lower electrode layer can be prevented from growing to layers overlying the piezoelectric thin-film buffer layer. In addition, granular crystals have more grain boundaries in the in-plane direction than columnar crystals. Thus, the stress applied by the lower electrode layer can be reduced. Accordingly, the surface morphology of the piezoelectric thin-film layer is less likely to be degraded.

DESCRIPTION OF EMBODIMENTS

Hereinafter, the present invention will be made clear through description of specific embodiments according to the present invention with reference to drawings.

Figure 1:
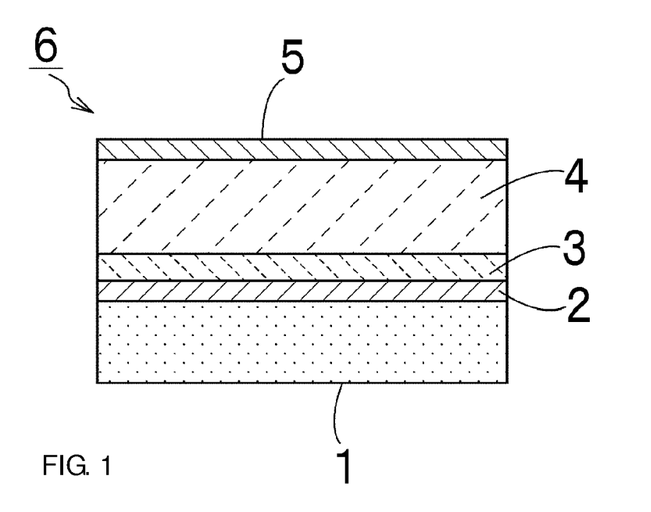
FIG. 1 is an elevational cross-sectional view of a piezoelectric thin-film element produced by a production method according to an embodiment of the present invention.
Figure 2A:
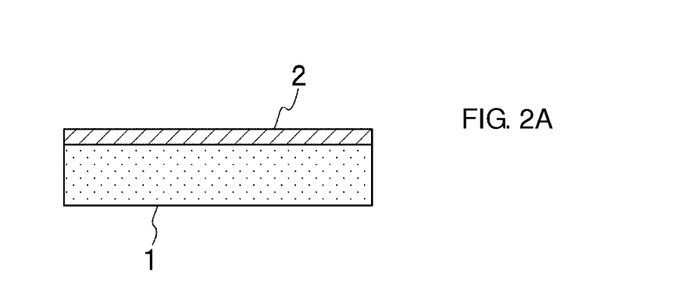
FIGS. 2(a) to 2(c) are elevational cross-sectional views for illustrating a method for producing a piezoelectric thin-film element according to an embodiment of the present invention.
Figure 2B:
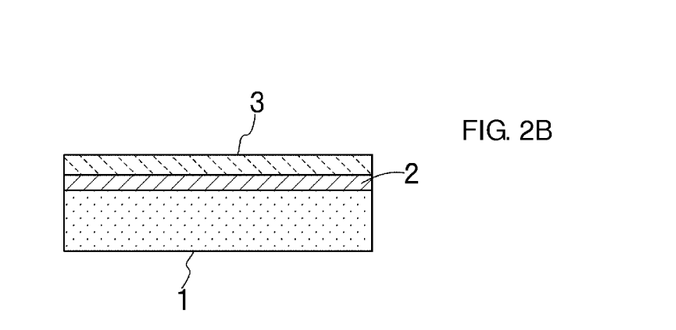
Figure 2C:
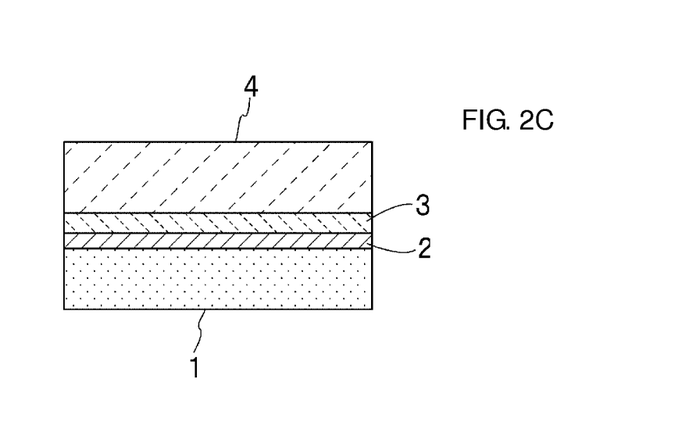

Referring to FIGS. 1 and 2(a) to 2(c), a method for producing a piezoelectric thin-film element according to a first embodiment of the present invention will be described. FIG. 1 is an elevational cross-sectional view of a piezoelectric thin-film element produced by the method for producing a piezoelectric thin-film element according to the first embodiment of the present invention. FIGS. 2(a) to 2(c) are elevational cross-sectional views for illustrating the method for producing a piezoelectric thin-film element according to the first embodiment of the present invention.

Referring to FIG. 2(a), a lower electrode layer 2 was first formed on a substrate 1. The substrate 1 was a silicon substrate having (100) crystal plane orientation. Specifically, the silicon substrate used as the substrate 1 in the present embodiment has a thickness of 0.35 μm and includes in its surface a thermal oxidation film ($SiO_2$ film) that is formed by a heat treatment and has a thickness of 750 nm.

In the present embodiment, the above-described silicon substrate was used as the substrate 1. However, the material of the substrate 1 may be selected from various materials in the present invention. Such materials include, in addition to silicon, insulating ceramics such as low temperature co-fired ceramics (LTCC) and $Al_2O_3$, piezoelectric single crystals such as $LiTaO_3$, $LiNbO_3$, and quartz, semiconductors such as SiC, GaAs, and GaN, and glass.

On the substrate 1, the lower electrode layer 2 was formed by sputtering. The lower electrode layer 2 in the present embodiment is a laminated film in which a Pt film is formed on a $TiO_2$ film. The Pt film has a thickness of 100 nm and the $TiO_2$ film has a thickness of 20 nm. Accordingly, the $TiO_2$ film was first formed on the substrate 1 by sputtering and the Pt film was then formed by sputtering in the present embodiment. The $TiO_2$ film was formed under the following conditions: substrate temperature of 200° C., $O_2/(Ar+O_2)=0.5$, and sputtering pressure of 0.3 Pa. The target used was a metal target composed of Ti. The $TiO_2$ film was formed by reactive sputtering.

The Pt film was formed under the following conditions: a Pt target serving as the target, substrate temperature of 420° C., Ar atmosphere, and sputtering pressure of 0.4 Pa.

The material forming the lower electrode layer 2 is not particularly limited. Such materials include appropriate metals such as Au, Ag, Pt, Ru, Ir, and Cu, alloys of such metals, and electrically conductive oxides such as $LaNiO_3$, $SrRuO_3$, and $RuO_2$. A laminated electrode formed of such materials may be used. Alternatively, the lower electrode layer 2 may be constituted by a single metal film instead of such a laminated film. As to the lower electrode layer, a low-resistance silicon substrate may be used that is doped with As or the like so as to have integrated functions of a substrate and a lower electrode layer.

The following structure may be employed: a sacrificial layer is formed on a substrate; on the sacrificial layer, a lower electrode layer, a piezoelectric thin-film buffer layer, a piezoelectric thin-film layer, and an upper electrode layer are formed; and the sacrificial layer is then removed. The sacrificial layer is formed of poly Si, $SiO_2$, ZnO, or $LaNiO_3$.

After the lower electrode layer 2 was formed, referring to FIG. 2(b), a piezoelectric thin-film buffer layer 3 was formed by sputtering. The piezoelectric thin-film buffer layer 3 in the present embodiment is formed of potassium sodium niobate, which is a perovskite piezoelectric material containing K, Na, and Nb, and has a thickness of 100 nm.

The piezoelectric thin-film buffer layer 3 in the present embodiment was formed under the following conditions.

Substrate temperature of 300° C.; gas flow-rate ratio: $O_2/(Ar+O_2)=0.1$ (molar ratio); sputtering pressure of 0.3 Pa. A target having a composition of $(K_{0.5}Na_{0.5})NbO_3$ was used.

Subsequently, referring to FIG. 2(c), a piezoelectric thin-film layer 4 was formed on the piezoelectric thin-film buffer layer 3 by sputtering. The target used was the same target as that used for forming the piezoelectric thin-film buffer layer 3. Accordingly, the target had a composition of $(K_{0.5}Na_{0.5})NbO_3$. The sputtering conditions were substrate temperature of 700° C.; gas flow-rate ratio: $O_2/(Ar+O_2)=0.1$ (molar ratio); and sputtering pressure of 0.3 Pa. Thus, the piezoelectric thin-film buffer layer 3 and the piezoelectric thin-film layer 4 were formed such that the same target, the same gas flow-rate ratio, and the same sputtering pressure were employed, and only the substrate temperature was changed.

When the substrate temperature is 300° C., $(K_{0.5}Na_{0.5})NbO_3$ does not crystallize. That is, the piezoelectric thin-film buffer layer 3 is formed at such a low temperature that the piezoelectric thin-film buffer layer 3 does not crystallize. Accordingly, the piezoelectric thin-film buffer layer 3 is in the amorphous state at the stage where the piezoelectric thin-film buffer layer 3 is formed on the lower electrode layer 2.

In contrast, when the substrate temperature is 700° C., $(K_{0.5}Na_{0.5})NbO_3$ crystallizes. Accordingly, when the piezoelectric thin-film layer 4 is formed, the underlying layer, that is, the piezoelectric thin-film buffer layer 3 shifts from the amorphous state to the crystalline state.

Subsequently, referring to FIG. 1, an upper electrode layer 5 was formed on the piezoelectric thin-film layer 4 by vapor deposition. In the present embodiment, the upper electrode layer 5 is composed of Pt. Alternatively, the upper electrode layer 5 may be formed by another thin-film formation process such as sputtering or a thick-film formation process such as application of conductive paste.

Finally, a thermal annealing treatment was performed by exposure to a temperature at 750° C. for 10 minutes. Thus, a piezoelectric thin-film element 6 illustrated in FIG. 1 was provided.

In the above-described production steps, prior to the formation of the upper electrode layer 5, the surface morphology of the piezoelectric thin-film layer 4 was observed with an atomic force microscope (AFM). The result is illustrated in FIG. 3.

For comparison, a piezoelectric thin-film element of a comparative example was produced as in the above-described embodiment except that the piezoelectric thin-film buffer layer 3 was not formed. In the production of the piezoelectric thin-film element of the comparative example, the surface morphology of the piezoelectric thin-film layer prior to the formation of the upper electrode layer was observed with an AFM. The result is illustrated in FIG. 4.

Figure 3:
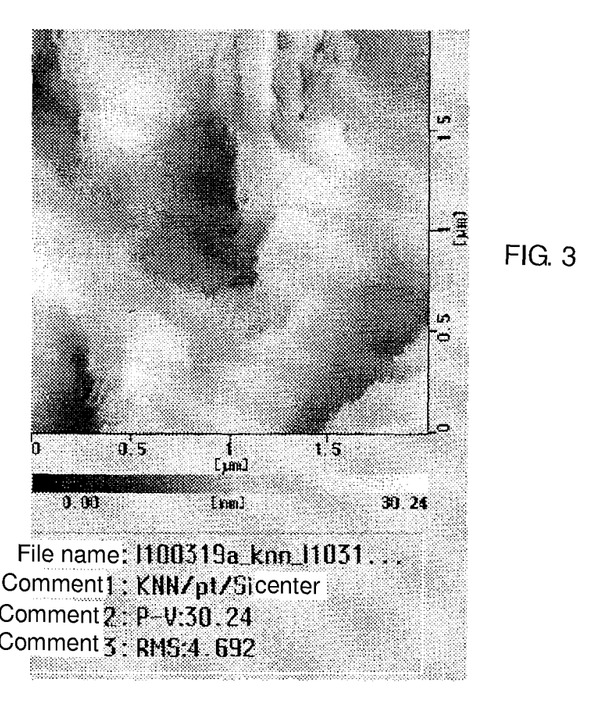
FIG. 3 is a micrograph observed with an atomic force microscope and illustrating the surface morphology of a piezoelectric thin-film layer formed by a production method according to an embodiment of the present invention.

The piezoelectric thin-film layer 4 in the piezoelectric thin-film element 6 of the embodiment in FIG. 3 had a RMS (root-mean-square roughness) of 4.7 nm.

Figure 4:
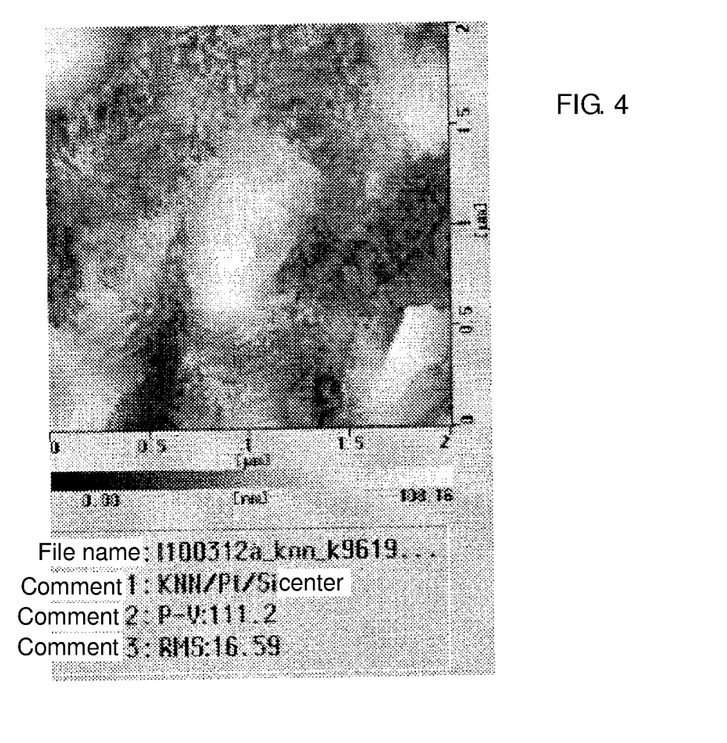
FIG. 4 is a micrograph observed with an atomic force microscope and illustrating the surface morphology of a piezoelectric thin-film layer of a piezoelectric thin-film element including no piezoelectric thin-film buffer layer, the element being prepared for comparison.

In contrast, the piezoelectric thin-film layer in the piezoelectric thin-film element of the comparative example in FIG. 4 had a RMS of 16.6 nm, which means a very high roughness.

Figure 5:
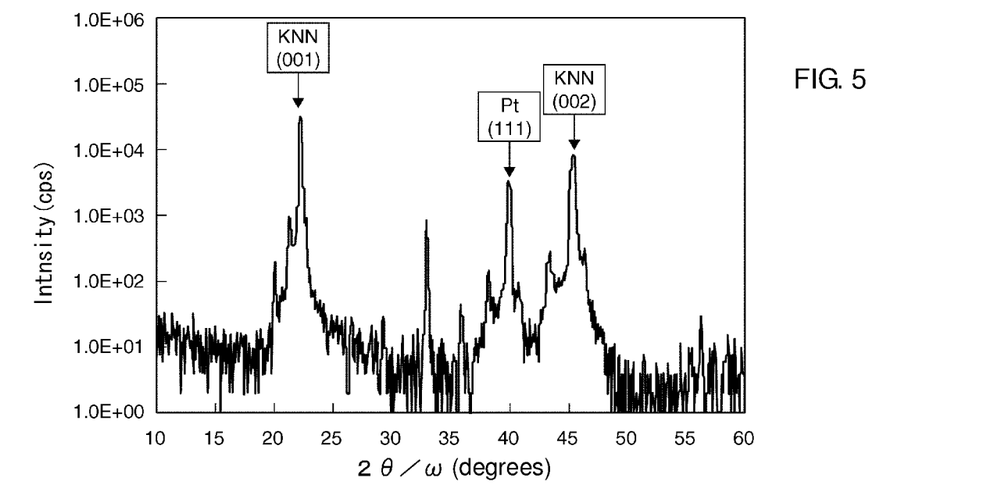
FIG. 5 is a $2\theta/\omega$ spectrum of a piezoelectric thin-film layer formed by a production method according to an embodiment of the present invention, the spectrum being obtained by XRD.
Figure 6:
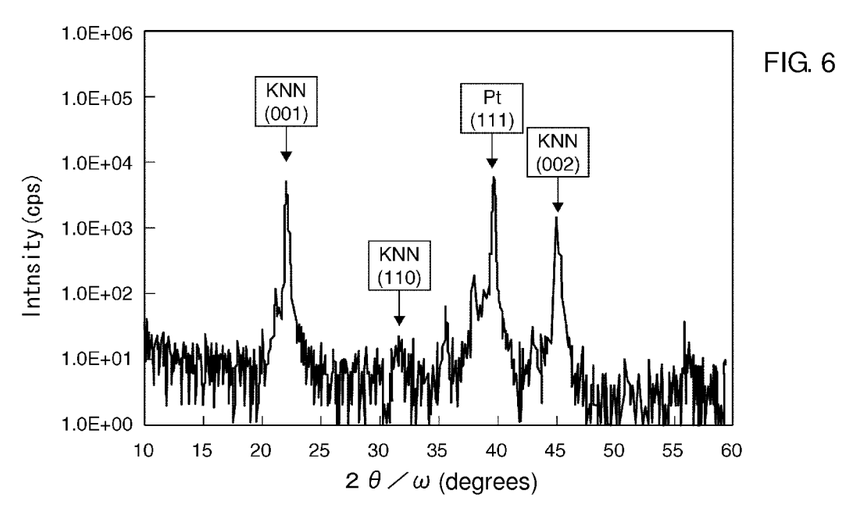
FIG. 6 is a $2\theta/\omega$ spectrum of a piezoelectric thin-film layer of a piezoelectric thin-film element including no piezoelectric thin-film buffer layer, the element being prepared for comparison, the spectrum being obtained by XRD.

Accordingly, the surface morphology of the piezoelectric thin-film layer according to the above-described embodiment can be made very good compared with the comparative example. FIG. 5 is a 2θ/ω spectrum of the piezoelectric thin-film layer 4 in the piezoelectric thin-film element 6 of the embodiment, the spectrum being obtained by XRD. FIG. 6 is a 2θ/ω spectrum of the piezoelectric thin-film layer in the piezoelectric thin-film element of the comparative example, the spectrum being obtained by XRD. In FIGS. 5 and 6, KNN denotes $(K_{0.5}Na_{0.5})NbO_3$.

Comparison between FIGS. 5 and 6 clearly indicates that $(K_{0.5}Na_{0.5})NbO_3$ is highly (001) oriented in the piezoelectric thin-film layer 4 in the piezoelectric thin-film element 6 of the embodiment, compared with the comparative example. That is, the piezoelectric thin-film layer 4 having high crystallinity can be formed according to the embodiment, compared with the comparative example.

According to the production method of the present embodiment, the surface morphology of piezoelectric thin-film layer 4 can be improved and the crystallinity can be made high. This is probably achieved by the following reason. Since the piezoelectric thin-film buffer layer 3 is initially formed prior to the formation of the piezoelectric thin-film layer 4 at such a low temperature that it does not crystallize, the surface morphology of the piezoelectric thin-film buffer layer 3 is less likely to be influenced by the surface morphology of the lower electrode layer 2. That is, the surface morphology of the piezoelectric thin-film buffer layer 3 becomes good. In this state, the piezoelectric thin-film layer 4 is formed by sputtering so that the piezoelectric thin-film buffer layer 3 and the piezoelectric thin-film layer 4 crystallize. Since the piezoelectric thin-film layer 4 is formed in the state where the underlying layer, that is, the piezoelectric thin-film buffer layer 3 has the good surface morphology, the formed piezoelectric thin-film layer 4 also has good surface morphology.

In contrast, a lower electrode layer is formed and then the piezoelectric thin-film layer is formed in the comparative example; the piezoelectric thin-film layer is probably influenced by the surface morphology of the lower electrode layer and hence the resultant piezoelectric thin-film layer has poor surface morphology.

In summary, a piezoelectric thin-film element according to the present embodiment including a piezoelectric thin-film layer having good surface morphology and high crystallinity can be provided. In addition, in the embodiment, since the piezoelectric thin-film buffer layer 3 and the piezoelectric thin-film layer 4 are formed with the same target, the production steps do not become complicated and the production cost does not considerably increase. Therefore, the piezoelectric thin-film element 6 including the piezoelectric thin-film layer 4 having good surface morphology can be provided without a considerable increase in the cost.

Alternatively, the piezoelectric thin-film layer 4 may be formed with a target that is different from the target for forming the piezoelectric thin-film buffer layer 3.

Figure 7:
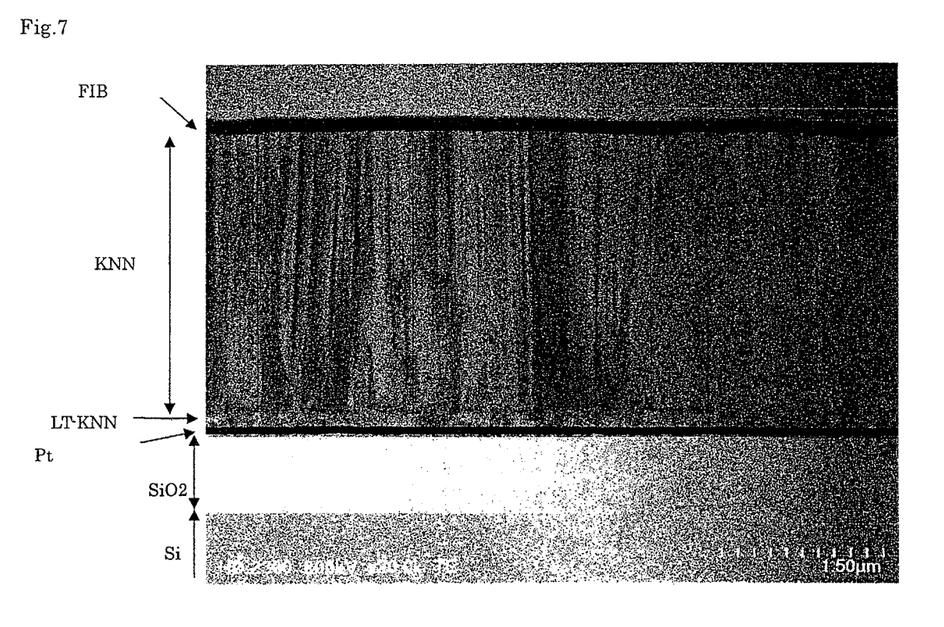
FIG. 7 is a transmission electron micrograph (at a magnification of 20) of a cross-sectional structure in a direction orthogonal to the surface of a piezoelectric thin-film layer of a piezoelectric thin-film element obtained in accordance with an embodiment of the present invention.
Figure 8:
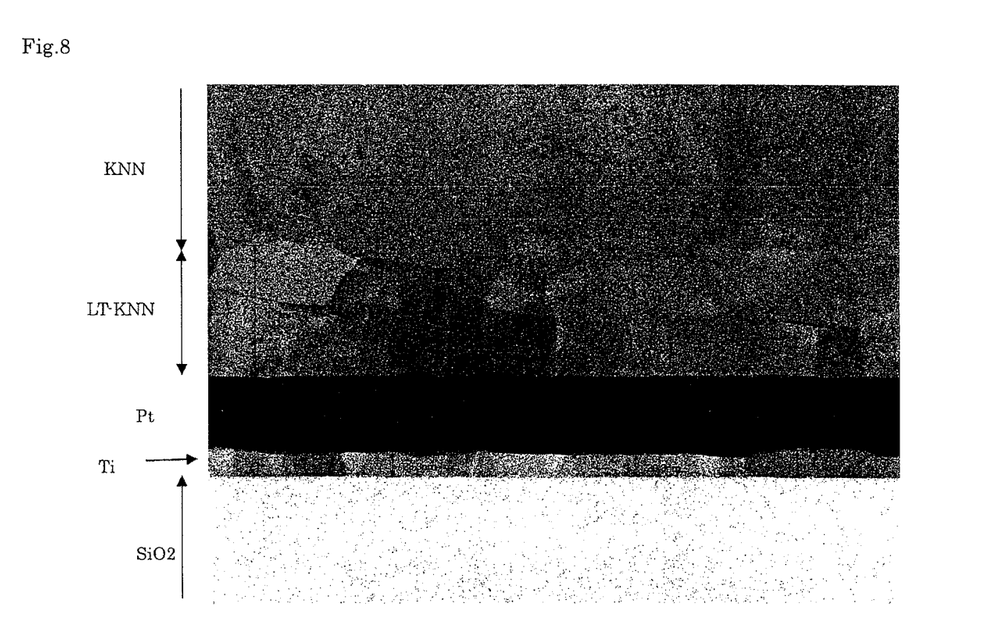
FIG. 8 is a transmission electron micrograph (at a magnification of 200) of a cross-sectional structure in a direction orthogonal to the surface of a piezoelectric thin-film layer of a piezoelectric thin-film element obtained in accordance with an embodiment of the present invention.

In the piezoelectric thin-film element 6 obtained in the embodiment, a cross-sectional structure in a direction orthogonal to the surface of the piezoelectric thin-film layer 4 was observed with a transmission electron microscope. The results are illustrated in FIGS. 7 and 8. FIG. 7 is a transmission electron micrograph at a magnification of 20. FIG. 8 is a transmission electron micrograph at a magnification of 200.

FIGS. 7 and 8 clearly indicate that the piezoelectric thin-film buffer layer 3 is formed on the Pt film forming the lower electrode layer 2; the piezoelectric thin-film buffer layer 3 contains granular crystals; in contrast, the piezoelectric thin-film layer 4 contains columnar crystals. Because of such a crystalline structure, the piezoelectric thin-film buffer layer 3 can reduce stress applied by the Pt film, that is, the lower electrode layer 2. This is probably achieved by the following reason.

The piezoelectric thin-film buffer layer 3 contains granular crystals generated due to discontinuity of potassium sodium niobate crystals grown from the Pt film forming the lower electrode layer 2. Thus, information from the lower electrode layer 2 can be blocked. As a result, a pyrochlore phase which is different from but closely lattice-matches with the lower electrode layer 2 can be prevented from growing to layers overlying the piezoelectric thin-film buffer layer 3. In addition, granular crystals have more grain boundaries in the in-plane direction than columnar crystals. Thus, the stress applied by the lower electrode layer 2 can be probably reduced. Accordingly, the surface morphology of the piezoelectric thin-film layer 4 is less likely to be degraded.

In the piezoelectric thin-film buffer layer 3 and the piezoelectric thin-film layer 4 of the piezoelectric thin-film element 6 obtained in the embodiment, a K/Na ratio was measured by energy dispersive X-ray analysis (EDX). Specifically, K/Na ratios at Points 1 to 6 indicated in a transmission electron micrograph in FIG. 9 were measured by energy dispersive X-ray analysis. The measurement results are described in Table 1 below.

TABLE 1

| Point | Remark | K/Na |
|---|---|---|
| 1 | K/Na uniform portion | 0.99 |
| 2 | K/Na uniform portion | 0.96 |
| 3 | K/Na uniform portion | 0.89 |
| 4 | K/Na nonuniform portion | 0.29 |
| 5 | K/Na nonuniform portion | 1.90 |
| 6 | K/Na nonuniform portion | 0.66 |

Figure 9:
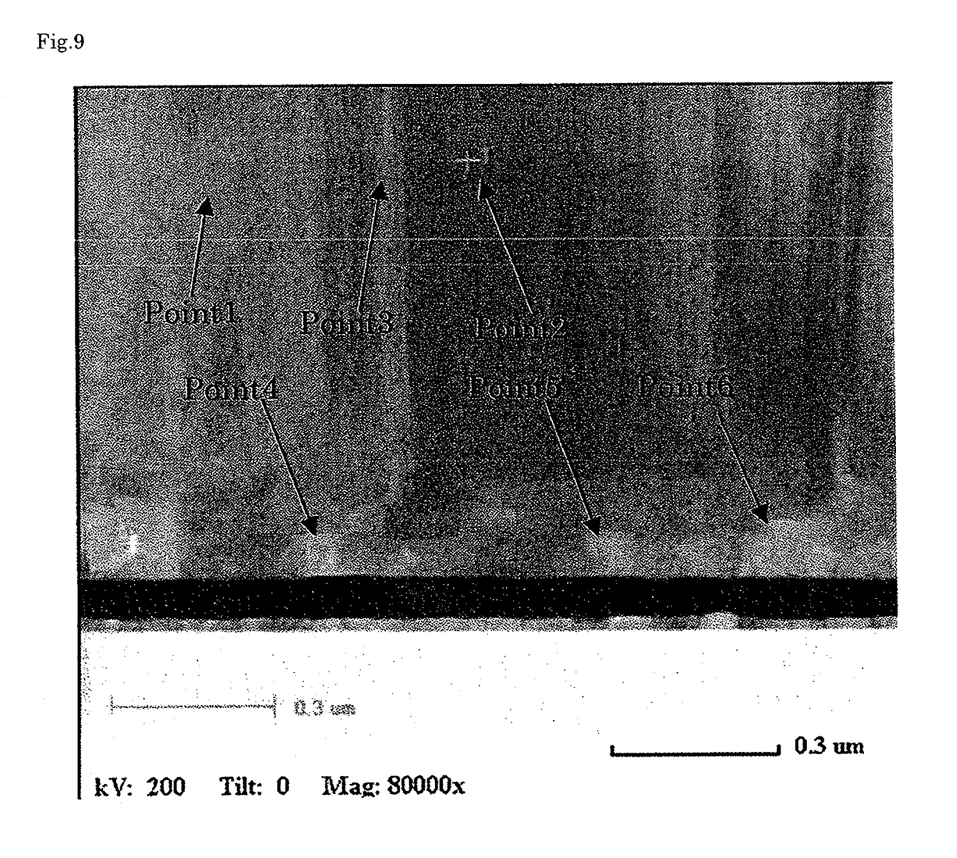
FIG. 9 is a transmission electron micrograph indicating Points 1 to 6 at which K/Na ratios were measured in a piezoelectric thin-film buffer layer and a piezoelectric thin-film layer of a piezoelectric thin-film element obtained in accordance with an embodiment of the present invention.

Table 1 clearly indicates that, in Points 4 to 6 positioned in the piezoelectric thin-film buffer layer 3, the K/Na ratios in atomic ratios are considerably different from 1:1. Specifically, the piezoelectric thin-film buffer layer 3 includes portions where the Na content is much higher than the K content and portions where the K content is much higher than the Na content. In contrast, in Points 1 to 3 positioned in the piezoelectric thin-film layer 4, the K/Na ratios in atomic ratios are 0.89 to 0.99, that is, substantially 1:1.

As described above, the K/Na ratios are different between the piezoelectric thin-film buffer layer 3 and the piezoelectric thin-film layer 4 and, as a result, the film quality of the piezoelectric thin-film layer 4 can be improved. This is probably achieved by the reason below. In the following description, K and Na are also used as symbols respectively denoting the K content and the Na content.

In general, in the case of forming a potassium sodium niobate film having a composition in which a K/Na ratio is substantially 1:1 in order to obtain a potassium sodium niobate film that has a stabilized composition, a potassium sodium niobate film having a composition satisfying K>Na or Na>K is first formed as an underlying layer. When a potassium sodium niobate film having a composition satisfying K>Na is formed as an underlying layer, the lattice constant of this layer is higher than the lattice constant of a potassium sodium niobate film having a composition in which a K/Na ratio is substantially 1:1. Conversely, when a potassium sodium niobate film having a composition satisfying Na>K is formed as an underlying layer, the lattice constant of this layer is lower than the lattice constant of a potassium sodium niobate film having a composition in which a K/Na ratio is substantially 1:1.

When such an underlying layer having a single composition is formed on a substrate, the underlying layer is constrained by the substrate. A stress caused by the constraint may influence a potassium sodium niobate film formed on the upper surface of the underlying layer. In contrast, when the piezoelectric thin-film buffer layer 3 in which the K/Na ratio is different from 1:1, two potassium sodium niobates, that is, a potassium sodium niobate having a composition satisfying K>Na and a potassium sodium niobate having a composition satisfying Na>K are present. As described above, since the piezoelectric thin-film buffer layer 3 corresponding to the underlying layer does not have a single composition, the piezoelectric thin-film buffer layer 3 contains a large number of crystals having different lattice constants. Accordingly, the constraint forces applied from the substrate due to lattice matching cancel out. Thus, on the piezoelectric thin-film buffer layer 3, the piezoelectric thin-film layer 4 constituted by a potassium sodium niobate film having a composition in which a K/Na ratio is substantially 1:1 can be formed so as to have a stabilized composition.

In the above-described embodiment, the piezoelectric thin-film buffer layer 3 constituted by a single layer was formed. Alternatively, as illustrated in a modification in FIG. 10, a plurality of piezoelectric thin-film buffer layers 3a to 3c may be sequentially formed. That is, the piezoelectric thin-film buffer layer 3 may have a structure in which the plurality of piezoelectric thin-film buffer layers 3a to 3c are stacked. In this case, it is preferred that the film-formation temperature be increased continuously or in a stepwise manner from the piezoelectric thin-film buffer layer 3a on the lower electrode layer 2 side to the piezoelectric thin-film buffer layer 3c on the upper electrode layer 5 side. As a result, the surface morphology of the piezoelectric thin-film buffer layer 3c can be made better and the surface morphology of the piezoelectric thin-film layer 4 formed thereon can be further improved.

Figure 10:
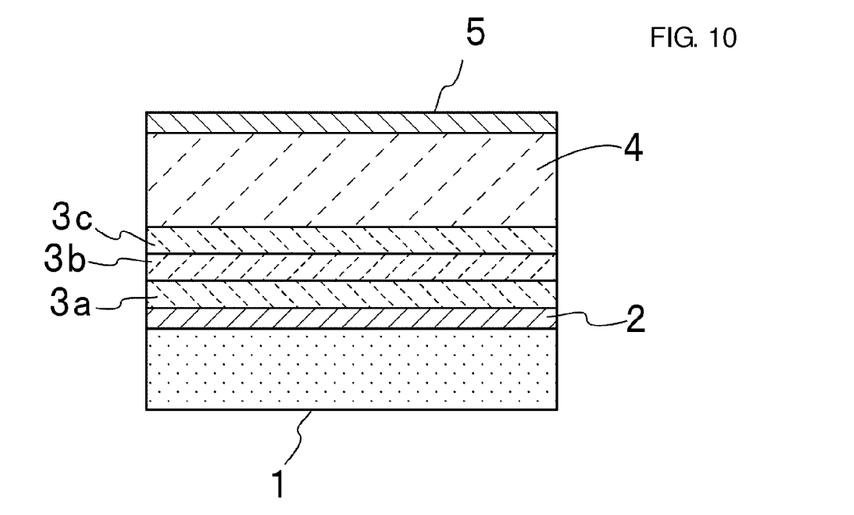
FIG. 10 is an elevational cross-sectional view of a piezoelectric thin-film element according to a modification of the present invention.

In such a case, all the plurality of piezoelectric thin-film buffer layers 3a to 3c are preferably formed by sputtering with the same target. As a result, complication of the production steps can be avoided. Alternatively, the piezoelectric thin-film buffer layers 3a to 3c may be formed by sputtering with different targets.

In the above-described embodiment, the film-formation temperature for the piezoelectric thin-film buffer layer 3 was 300° C. However, another temperature that does not cause crystallization may be employed. Accordingly, the film-formation temperature may be 350° C. or less in the case of the piezoelectric thin-film buffer layer 3 having the above-described composition. However, when the film-formation temperature for the piezoelectric thin-film buffer layer 3 is excessively low, the film may contain water. Accordingly, the film-formation temperature for the piezoelectric thin-film buffer layer 3 is preferably 100° C. or more. When the piezoelectric thin-film buffer layer 3 is formed by MOCVD, carbon from the source gas may remain in the thin film and hence the film-formation temperature is preferably 300° C. or more.

From our experimental results, the temperature at which $(K_{0.5}Na_{0.5})NbO_3$ crystallizes is 450° C. or more.

In the above-described embodiment, the film-formation temperature for the piezoelectric thin-film layer 4 was 700° C. However, in order to form the piezoelectric thin-film layer 4 that is highly (001)-oriented, the film-formation temperature is 450° C. or more and desirably in the temperature range of 500° C. to 800° C. When the film-formation temperature is excessively high, a large number of defects of K or Na are formed and the probability of the generation of a heterophase, such as the pyrochlore phase, may be increased.

In order to form the piezoelectric thin-film buffer layer 3 having good surface morphology, the piezoelectric thin-film buffer layer 3 preferably has a thickness in the range of 30 to 500 nm.

Although the thickness of the piezoelectric thin-film layer 4 varies in accordance with applications, in order to achieve good piezoelectricity, the thickness is desirably in the range of 0.2 to 3 μm.

As with the lower electrode layer 2, a material for forming the upper electrode layer 5 can be selected from various metal materials. The upper electrode layer 5 may be constituted by laminated films or a single metal film. The upper electrode layer 5 is preferably formed of the same material as in the lower electrode layer 2, resulting in cost reduction. Alternatively, the upper electrode layer 5 may be formed of a material different from that of the lower electrode layer 2.

In the embodiments having been described so far, the surface morphology of the piezoelectric thin-film layer 4 becomes good because the piezoelectric thin-film buffer layer 3 is formed at such a low temperature that the piezoelectric thin-film buffer layer 3 does not crystallize and, the piezoelectric thin-film layer 4 is formed on the piezoelectric thin-film buffer layer 3 having good surface morphology. Thus, the film-formation process for the piezoelectric thin-film buffer layer 3 and the piezoelectric thin-film layer 4 are not limited to sputtering in the present invention; and film-formation processes performed with appropriate heating such as MOCVD and PLD may be used.

In the present embodiment, $(K_{0.5}Na_{0.5})NbO_3$ is used as a potassium sodium niobate-based material having a perovskite structure containing K, Na, and Nb. However, this composition is not limitative. Specifically, a potassium sodium niobate-based material having a composition represented by the following general formula (1) may also be employed.

$$(K_{1-a-b/2}Na_{a-b/2}A_b)(Nb_{1-c}B_c)O_3 \quad \text{formula (1)}$$

In the general formula (1), A is at least one element from Li, Ag, Ca, Sr, Bi, and Gd; B is at least one element selected from the group consisting of Ta, Zr, Ti, Al, Sc, and Hf; and a, b, and c satisfy $0<a\leq0.9$, $0\leq b\leq0.3$, $0\leq a+b\leq0.9$, and $0\leq c\leq0.3$.

In the potassium sodium niobate-based material, the composition represented by the general formula (1) may additionally contain another metal or metal oxide. Such additional metal or metal oxide may be at least one metal and/or oxide of the metal, the at least one metal being selected from the group consisting of Mn, Mg, Zn, Fe, Cu, and Yb. The total content of such metal and/or metal oxide added with respect to 100 mol % of the above-described composition is desirably 10 mol % or less. In such cases, as with the above-described embodiment, the piezoelectric thin-film layer 4 and the piezoelectric thin-film buffer layer 3 having good surface morphology can be formed.

Since the potassium sodium niobate-based material does not contain lead, the environmental load can be reduced.

The film-formation temperature for the piezoelectric thin-film buffer layer 3 is desirably equal to or lower than the film-formation temperature for the lower electrode layer 2. In such cases, the surface morphology of the piezoelectric thin-film buffer layer 3 can be made good even when the lower electrode layer 2 is formed at a high temperature and has poor surface morphology. Accordingly, the surface morphology of the piezoelectric thin-film layer 4 formed on the piezoelectric thin-film buffer layer 3 can be made good.

A piezoelectric thin-film element according to the present invention is applicable to various piezoelectric actuators and piezoelectric sensors.

REFERENCE SIGNS LIST 1 substrate
2 lower electrode layer
3 piezoelectric thin-film buffer layer
3a to 3c piezoelectric thin-film buffer layers
4 piezoelectric thin-film layer
5 upper electrode layer
6 piezoelectric thin-film element

The invention claimed is:

1. A piezoelectric thin-film element comprising a substrate; a lower electrode layer on the substrate; and at least one piezoelectric thin-film buffer layer containing granular crystals on the lower electrode layer, a crystallized piezoelectric thin-film layer on the piezoelectric thin-film buffer layer, and an upper electrode layer on the piezoelectric thin-film layer, wherein the piezoelectrics of the piezoelectric thin-film buffer layer and the piezoelectric thin-film layer have a perovskite structure containing K, Na, and Nb.

2. A piezoelectric thin-film element according to claim 1 in which the piezoelectric thin-film layer contains columnar crystals.

3. The piezoelectric thin-film element according to claim 1, wherein the K/Na ratio in the piezoelectric thin-film buffer layer and the piezoelectric thin-film layer are different.

4. A piezoelectric thin-film element comprising a substrate; a lower electrode layer on the substrate; and at least one piezoelectric thin-film buffer layer containing granular crystals on the lower electrode layer, a crystallized piezoelectric thin-film layer on the piezoelectric thin-film buffer layer, and an upper electrode layer on the piezoelectric thin-film layer, wherein the piezoelectrics of the piezoelectric thin-film buffer layer and the piezoelectric thin-film layer have a composition represented by the formula $$(K_{1-a-b/2}Na_{a-b/2}A_b)(Nb_{1-c}B_c)O_3$$

wherein A is at least one element selected from the group consisting of Li, Ag, Ca, Sr, Bi, and Gd; B is at least one element selected from the group consisting of Ta, Zr, Ti, Al, Sc, and Hf; $0<a\leq0.9$, $0\leq b\leq0.3$, $0\leq a+b\leq0.9$, and $0\leq c\leq0.3$.

5. The piezoelectric thin-film element according to claim 4, wherein the piezoelectric thin-film buffer layer and the piezoelectric thin-film layer contain at least one metal or oxide of the metal, in which the metal is selected from the group consisting of Mn, Mg, Zn, Fe, Cu, and Yb, and the total content of the at least one metal and oxide of the metal is 10 mol % or less with respect to 100 mol % of the composition of said formula.

6. A piezoelectric thin-film element comprising a substrate; a lower electrode layer on the substrate; and at least one piezoelectric thin-film buffer layer containing granular crystals on the lower electrode layer, a crystallized piezoelectric thin-film layer on the piezoelectric thin-film buffer layer, and an upper electrode layer on the piezoelectric thin-film layer in which the piezoelectric thin-film buffer layer has a thickness of 30 to 500 nm, and the piezoelectric thin-film layer has a thickness of 0.2 to 3 μm.

7. The piezoelectric thin-film element according to claim 6, wherein both of said piezoelectrics contain Na and K, and the K/Na ratio in the piezoelectric thin-film buffer layer and the piezoelectric thin-film layer are different.

8. The piezoelectric thin-film element according to claim 5 in which the piezoelectric thin-film buffer layer has a thickness of 30 to 500 nm, and the piezoelectric thin-film layer has a thickness of 0.2 to 3 μm.

9. The piezoelectric thin-film element according to claim 4 in which the piezoelectric thin-film buffer layer has a thickness of 30 to 500 nm, and the piezoelectric thin-film layer has a thickness of 0.2 to 3 μm.

* * * * *